(12) United States Patent
Watkins et al.

(10) Patent No.: US 7,527,826 B2
(45) Date of Patent: May 5, 2009

(54) ADHESION OF A METAL LAYER TO A SUBSTRATE BY UTILIZING AN ORGANIC ACID MATERIAL

(75) Inventors: James J. Watkins, South Hadley, MA (US); Yinfeng Zong, Milford, MA (US)

(73) Assignee: University of Massachusetts, Boston, MA (US)

( * ) Notice: Subject to any disclaimer, the term of this patent is extended or adjusted under 35 U.S.C. 154(b) by 0 days.

(21) Appl. No.: 11/104,743

(22) Filed: Apr. 13, 2005

(65) Prior Publication Data
US 2005/0233561 A1    Oct. 20, 2005

Related U.S. Application Data

(60) Provisional application No. 60/562,031, filed on Apr. 14, 2004.

(51) Int. Cl.
*B05D 3/00* (2006.01)
(52) U.S. Cl. ............ 427/304; 427/301; 427/229; 427/383.1
(58) Field of Classification Search .......... 427/419.8, 427/419.5, 301, 304
See application file for complete search history.

(56) References Cited

U.S. PATENT DOCUMENTS

| | | | | |
|---|---|---|---|---|
| 5,545,432 | A * | 8/1996 | DeGuire et al. ............ 427/226 |
| 5,789,027 | A * | 8/1998 | Watkins et al. ............ 427/250 |
| 6,146,767 | A * | 11/2000 | Schwartz ................... 428/457 |
| 6,383,575 | B1 * | 5/2002 | Badyal et al. .............. 427/535 |
| 6,589,457 | B1 * | 7/2003 | Li et al. ..................... 264/44 |
| 6,689,027 | B1 | 2/2004 | Gardikis, Jr. |
| 2003/0008417 | A1 * | 1/2003 | Suzuki ....................... 438/3 |
| 2003/0149187 | A1 * | 8/2003 | Kano et al. ............. 525/328.2 |
| 2003/0157248 | A1 | 8/2003 | Watkins et al. |
| 2003/0161954 | A1 | 8/2003 | Blackburn et al. |
| 2004/0132317 | A1 | 7/2004 | Morgen et al. |
| 2005/0008777 | A1 * | 1/2005 | McCleskey et al. ......... 427/226 |
| 2006/0145351 | A1 | 7/2006 | Watkins et al. |

OTHER PUBLICATIONS

Ganesan et al. "Polyelectrolyte nanolayers as diffusion barriers for Cu metallization." A.P.L., 83:16, pp. 3302-3304, 2003.
Ramanath et al. "Self-Assembled Subnanolayers as Interfacial Adhesion Enhancers and Diffusion Barriers for Integrated Circuits" 83:2, pp. 383-385, 2003.
Yinfeng Zong et al., "Sacrificial Adhesion Promotion Layers for Copper Metallization of Device Structures", Langmuir, vol. 20, No. 21, 2004, pp. 9210-9216.

(Continued)

*Primary Examiner*—Timothy H Meeks
*Assistant Examiner*—David Turocy
(74) *Attorney, Agent, or Firm*—Fish & Richardson P.C.

(57) ABSTRACT

Methods and resulting structures are described in which a metal layer is adhered to a surface of a substrate. The methods involve applying a sacrificial acidic organic layer to the surface of the substrate prior to depositing the metal layer onto the substrate. During deposition of the metal layer, the sacrificial acidic organic layer is substantially consumed, thereby leaving behind a metal/substrate interface that has excellent adhesion properties.

30 Claims, 11 Drawing Sheets

OTHER PUBLICATIONS

Young Suk Kim, et al., "X-ray photoelectron spectroscopic characterization of the adhesion behavior of chemical vapor deposited copper films", J. Vac. Sci. Technol. A 19(5) Sep./Oct. 2001, p. 2642-2651.

I.C. McNeill et al., "Thermal degradation behaviour of acrylic salt polymers and ionomers," Die Angewandte Makromolekulare Chemie, 261/262 (1998), 157-172 (Nr.4626).

* cited by examiner

ADHESION OF A METAL LAYER TO A SUBSTRATE BY UTILIZING AN ORGANIC ACID MATERIAL

CROSS-REFERENCE TO RELATED APPLICATIONS

Under 35 USC §119(e)(1), this application claims the benefit of Provisional Patent Application No. 60/562,031, entitled "ADHESION OF A METAL LAYER TO A SUBSTRATE AND RELATED STRUCTURES," filed on Apr. 14, 2004, the entire contents of which are hereby incorporated by reference.

STATEMENT AS TO FEDERALLY SPONSORED RESEARCH

This invention was made with Government support under grant numbers CTS-9734177 and CTS-0245002 awarded by the National Science Foundation. The Government has certain rights in the invention.

FIELD OF THE INVENTION

The invention relates to methods of adhering a metal layer to a substrate and related devices.

BACKGROUND OF THE INVENTION

Fabrication of integrated circuits and other structures involves sequential deposition of layers of insulating, semiconducting, and conducting materials on a substrate. Adhesion properties of adjacent layers in structures are of great importance to ensure structural integrity and reliability. Poor and/or weak adhesion properties in these structures can be caused by containments at the interface between adjacent layers. For example, in structures formed using chemical vapor deposition (CVD), atomic layer deposition (ALD), or chemical fluid deposition (CFD), contaminants, such as contaminants derived from ligands, fluorine, and other contaminating materials released during the deposition process, can deposit at the interface and interfere with adhesion of a newly deposited layer. Other contaminants, such as oxides formed on the substrate and/or the deposited layer can also contribute to poor adhesion.

One method for improving the adhesion of a metal layer to a substrate surface involves the use of self-assembled monolayers of mercapto-propyl-trimethoxy-silane, e.g., as described by Ramanath and co-workers in *Self-Assembled Subnanolayers as Interfacial Adhesion Enhancers and Diffusion Barriers for Integrated Circuits*, 83(2): 383-85, 2003. The self-assembled monolayers (SAMs) are applied to the substrate prior to physical vapor deposition of the metal layer. The SAMs act as a coupling agent (e.g., as an adhesive) to bind the metal layer to the substrate. The increased adhesion properties in these structures rely on the presences and the stability of the SAMs at the interface. However, the presence of the SAMs, due to their non-conductive nature, can also have deleterious effects on the electronic performance of the structure.

Another method for improving the adhesion of a metal layer to a substrate surface involves the use of alternating layers of polyethyleneimine (PEI) and polyacrylic acid (PAA) as binding agents between the substrate surface and the deposited metal layer. Like the method involving the SAMs described above, the alternating layers of PEI and PAA remain within the structure after the deposition of the metal layer (e.g., the alternating layers of PEI and PAA are sandwiched between the substrate and the metal layer) and can effect the electronic performance of the structure.

SUMMARY OF THE INVENTION

The invention features new methods for adhering metal layers to substrate surfaces, and is based, in part, on the discovery that adhesion between a metal layer and a substrate can be enhanced if one applies an acidic organic layer to the surface of the substrate prior to depositing one or more metal species (e.g., metal deposits) on the substrate. The metal species are deposited under conditions in which the acidic organic layer undergoes a reaction and is substantially consumed to such an extent that an interface formed between the substrate and a layer formed of the metal deposits (e.g., the metal layer) includes little or no acidic organic material. Thus, the interface between the substrate and the layer of metal deposit is substantially free of acidic organic materials. In addition, the reaction and consumption (e.g., removal, desorbtion) of the acidic organic layer can either reduce, etch, or otherwise remove oxides (e.g., metal oxides and/or substrate oxides) along the interface, thereby reducing the amount of contaminating oxides and significantly enhancing both the adhesion of the metal layer to the substrate and the electrical performance of the device.

In general, in a first aspect, the invention features methods that include providing an organic acid material on a surface of a substrate and exposing the organic acid material on the substrate surface to a precursor material under conditions that enable a layer of a deposited material to form on the substrate surface from the precursor material, wherein there is substantially no organic acid material at an interface between the substrate surface and the layer of the deposited material.

In a further aspect, the invention features methods that include providing an organic acid material on a surface of a substrate and exposing the organic acid material on the substrate surface to a metal precursor under conditions that enable a layer of a metal to form on the substrate surface from the metal precursor.

In general, in another aspect, the invention features methods that include providing an organic acid material on a surface of a substrate and exposing the organic acid material to a precursor material while reducing the precursor material to deposit a layer including a metal on the surface of the substrate.

In general, in a another aspect, the invention features methods for adhering a metal layer to a substrate. The methods include providing an organic acid layer on a surface of a substrate and depositing the metal layer on the organic acid layer at a temperature greater than about 75° C., e.g., about 85° C., about 100° C., about 115° C., about 150° C., about 175° C., about 200° C., about 225° C., about 250° C., about 270° C., about 290° C., or higher.

The invention also features methods for adhering metal layers to substrates by providing an organic acid material on a surface of the substrate, depositing clusters of metal on the organic acid material, heating the substrate to a temperature at which the metal reacts with the organic acid material (e.g., heating to a temperature of about 100° C., about 150° C., about 200° C., about 250° C., about 290° C. or higher), and depositing the metal layer on the surface of the substrate including the clusters. The organic acid layer can be substantially consumed prior to depositing the metal layer.

Various implementations of the methods can include one or more of the following features.

Providing the organic acid material on the surface can include forming a layer including the organic acid material on the surface. The layer including the organic acid material can be formed by polymerizing a precursor to the organic acid material. The precursor to the organic acid material can be polymerized by thermal polymerization or photopolymerization. The precursor to the organic acid material can be acrylic acid and the organic acid material can be polyacrylic acid. The layer including the organic acid material can be a self-assembled monolayer. The organic acid material can be provided by adsorption of the organic acid material onto the substrate surface. The organic acid material can be provided by the reaction or decomposition of an organic material on the substrate surface. The organic acid material can be a polymer (e.g., a homopolymer or a copolymer).

The layer of the deposited material can be formed using chemical fluid deposition, chemical vapor deposition, or atomic layer deposition. The organic acid material can bind, chelate or undergo ligand exchange with the precursor material or a derivative of the precursor material. The deposited material can include a metal (e.g., copper, ruthenium, cobalt, platinum, palladium, gold, rhodium, silver, and nickel, and alloys and mixed metal deposits thereof. The organic acid material on the substrate surface can be exposed to the precursor material at a temperature of about 75° C. or more (e.g., about 100° C. or more, about 125° C. or more, about 150° C. or more, about 175° C. or more, about 200° C. or more). The substrate can include a silicon wafer. The substrate can include a silicon wafer including a native oxide layer. The substrate can also be a silicon wafer including a barrier layer. The barrier layer can be formed of a material selected from the group consisting of TiN, Ta, TaN, Ru and Co. The substrate can include a polymer. The substrate surface can include at least one trench or at least one via.

The invention also features articles including a substrate and a metal layer adhered to a surface of the substrate, wherein the adhesion of the metal layer to the substrate can withstand a scribe-tape test as defined herein.

In general, in a further aspect, the invention features articles that include a substrate and a metal layer adhered to a surface of the substrate so as to form an interface including an atomic concentration of carbon is about 10% or less and of oxygen is about 10% or less as determined by x-ray photoelectron spectroscopy.

Embodiments of the articles can include one or more of the following features.

The atomic concentration of carbon can be about 5% or less. The atomic concentration of oxygen can be about 5% or less. The metal layer can be adhered to the substrate so as to withstand a scribe tape test. The metal layer can include copper. The substrate can include or can be a silicon wafer. The substrate can include a barrier layer deposited on a silicon wafer.

In another aspect, the invention features integrated circuits that include an embodiment of the articles. Furthermore, embodiments of the articles can be formed using the methods described herein.

As used herein, the terms "substantially consumed," "little," "substantially no material," or "substantially free" mean that a material is removed or eliminated to such an extent that the resulting structure or device has an atomic concentration of less than about 10% (e.g., about 5% or less, about 3% or less, about 2% or less, about 1% or less, about 0.5% or less, 0.1% or less) of the material consumed (e.g., acidic organic material) as determined by x-ray photoelectron spectroscopy (XPS).

As used herein, the term "scribed tape test" refers to a process in which a 1 mm by 1 mm grid pattern is scored into a deposited metal layer through its entire depth (e.g., thickness of the layer) by a steel blade followed by the application and removal of a piece of Scotch® ¾ inch Magic™ tape available from 3M Corporation, Maplewood, Minn. (catalog number 205) (or a tape having an adhesive with comparable properties) over the grid pattern. Typically, the area of the grid pattern is about 0.2 cm$^2$ or more (e.g., about 0.5 cm$^2$ or more, about 1 cm$^2$ or more). If after the removal of the tape, all of the grid pieces are intact (e.g., none have been removed from the substrate), then the test specimen has passed the scribed tape test.

As used herein, a "supercritical solution" (or solvent or fluid) is one in which the temperature and pressure of the solution (or solvent or fluid) are greater than the respective critical temperature and pressure of the solution (or solvent or fluid). A supercritical condition for a particular solution (or solvent or fluid) refers to a condition in which the temperature and pressure are both respectively greater than the critical temperature and critical pressure of the particular solution (or solvent or fluid).

A "near-supercritical solution" (or solvent or fluid) is one in which the reduced temperature (actual temperature measured in Kelvin divided by the critical temperature of the solution (or solvent or fluid) measured in Kelvin) is greater than 0.8 and reduced pressure (actual pressure divided by critical pressure of the solution (or solvent or fluid)) of the solution (or solvent or fluid) is greater than 0.5, but the solution (or solvent or fluid) is not a supercritical solution. A near-supercritical condition for a particular solution (or solvent or fluid) refers to a condition in which the reduced temperature is greater than 0.8 and reduced pressure is greater than 0.5, but the condition is not supercritical. Under ambient conditions, the solvent can be a gas or liquid. The term solvent is also meant to include a mixture of two or more different individual solvents.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

BRIEF DESCRIPTION OF THE DRAWINGS

FIG. 4A is an x-ray photoelectron spectroscopy depth profile of the copper film. FIG.

4B is a Cu LMM Auger spectra for a region of the copper film corresponding to the dashed lines in the depth profile shown in FIG. 4A.

FIG. 7A is an x-ray photoelectron spectroscopy depth profile of the copper film. FIG. 7B is Cu 2p spectra collected within a region of the copper film corresponding to the dashed lines in the depth profile shown in FIG. 7A.

FIG. 8A is a graph that shows x-ray photoelectron spectroscopy spectra collected on a structure formed by depositing a copper film on top of a substrate including a Ta layer. FIG. 8B is a graph that shows x-ray photoelectron spectroscopy spectra collected on a structure formed by depositing a copper film on top of a substrate including a Ta layer and coated with polyacrylic acid.

DETAILED DESCRIPTION

General Methodology

Figure 1:
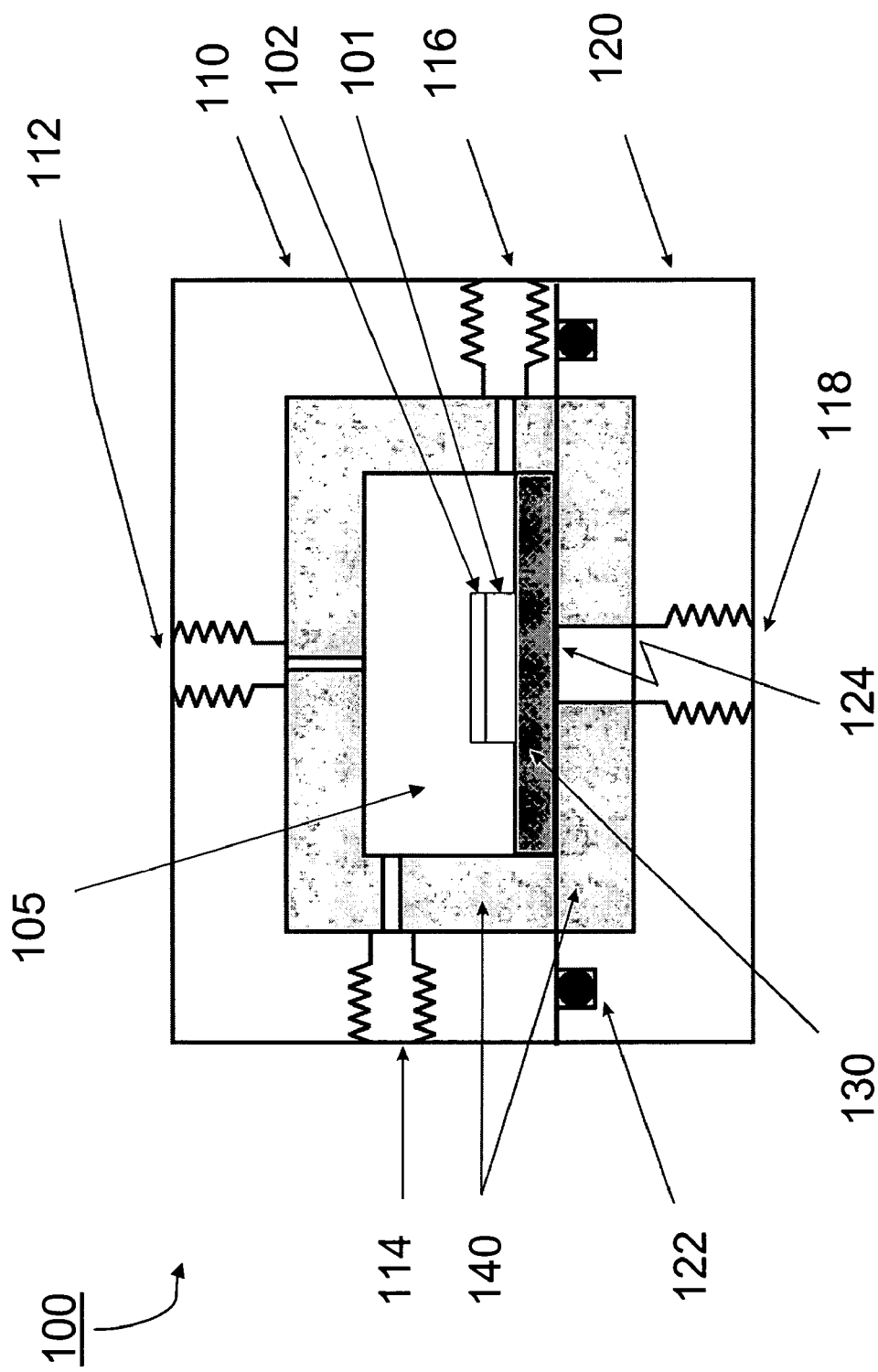
FIG. 1 is a schematic diagram of a cold wall reactor used to deposit a metal layer on a substrate.

Methods for enhancing adhesion of a metal layer to a substrate involve the following general procedure. A substrate is first coated with a thin layer (e.g., about 0.2 to about 30 nanometers) of an acidic organic polymer. Next, the coated substrate is exposed to precursor materials at conditions in which the precursor materials decompose and form metal deposits on the acidic organic layer. During the deposition of the metal deposits, the acidic organic layer decomposes and is consumed to such an extent that little or no acidic organic material (e.g., carbon and/or oxygen) is left at the surface of the substrate. As a result, an interface substantially free of acidic organic material is formed between the substrate and a layer formed of the metal deposits (e.g., the metal layer).

In some embodiments, the decomposition and consumption of the acidic organic layer has an effect on the interfacial chemistry. It is believed that the decomposition of the acidic organic layer either reduces or etches metal oxides and/or substrate oxides at the substrate surface (e.g., the interface between the substrate and the deposited metal layer) to such an extent that little or no oxygen is left at the interface.

A variety of deposition techniques can be used to provide a layer of acidic organic material on the substrate. For example, layers of acidic organic material can be deposited onto the substrate by spincoating. For example, a solution including an acidic organic material is applied to a surface of a rotating substrate to form a coating. As another example, layers of acidic organic material can be deposited by exposing the substrate to an acidic organic vapor. Other deposition techniques that can be used include ALD, CVD, ultra-violet or thermal polymerization of the organic acidic material, by self-assembled monolayers, or by surface modification chemistry.

In some embodiments, a precursor used to form the acidic organic layer is applied to the substrate. The acidic organic precursor can include an acidic material or a non-acidic material that can undergo a reaction to become acidic. For example, a non-acidic organic layer can be applied to the surface of the substrate and upon reaction or decomposition of the non-acidic organic layer the acidic organic layer is generated. For example the non-acidic layer can be poly(t-butyl acrylate) which upon hydrolysis yields polyacrylic acid.

In some embodiments, the precursor materials used to form the metal deposits (e.g., metal clusters and metal layer) are delivered to the coated substrate in a gas or vapor form (e.g., using CVD or ALD). In other embodiments, the precursor materials are delivered to the coated substrate in a solution (e.g., dissolved in a supercritical fluid, dissolved in a near critical fluid or dissolved in a liquid) using CFD. For example, Bis (2,2,7-trimethyloctane-3,5-dionato) Copper dissolved in supercritical or near supercritical $CO_2$ can be used to deposit a copper layer onto the substrate. Additional reagents/catalysts necessary for deposition of the metal layer may be delivered to the substrate together with the precursor. For example, in some embodiments, a reducing agent can be supplied with the precursor during the metal deposition step. Hydrogen is one example of a reducing agent that may be included in the reactor to initiate the deposition reaction.

In some embodiments, the acidic organic layer or the precursor to the acidic organic layer chelates, binds or undergoes a ligand exchange reaction with the metal precursor. Alternatively, or additionally, the acidic organic layer or precursor to the organic acidic layer chelates or binds to metal species deposited on the substrate.

Materials and Substrate Preparation

In general, the methods disclosed herein can be used to deposit materials on a variety of different substrate materials. Substrates can be homogeneous in composition or can include discrete portions having different composition (e.g., substrates can be multilayer articles). Furthermore, substrates can have flat, curved, and/or structured surfaces. Examples of substrates having structured surfaces include microstructured substrates, which include features (e.g., trenches and/or vias) that have characteristic dimensions in the micron and submicron range.

Typically, the substrate provides mechanical support for the structure. The substrate may also perform other functions such as, for example, serving as a dielectric material or as a diffusion barrier. At least a portion of the substrate can also provide electrical functionality to the structure. For example, the substrate can include a layer that carries or switches an electrical current or serves as a component in a capacitor, gate or other component of an electronic or semiconducting device. At least a portion of the substrate can also serve a barrier function in which it prevents or impedes the diffusion of material between adjacent layers. In some embodiments, the materials of the substrate can be selected to serve a function of improving electrogmigration resistance in a structure. In certain embodiments, at least a portion of the substrate serves an optical function, such as a component in an optical switch, filter or photonic device. In some embodiments, at least a portion of the substrate serves a magnetic function, such as, for example, as a component in a memory device. In some embodiments, at least a portion of the substrate serves a sensing function, such as, for example, as a component in a detector or a detector array.

Typically, the type of substrate will depend on the specific application of the structure. For example, a silicon wafer can be used as a substrate for a microelectronics application (e.g., for fabrication of an integrated circuit). Other examples include dense or porous silicates and carbon-doped oxides as dielectric materials and Ta, TaN, or TiN as diffusion barrier. As another example, a polymer flex print can be used as a substrate when manufacturing a circuit board. Substrate materials can include semiconductor and insulating materials. Examples of substrate materials include silicon wafers, glass sheets, and polymer substrates, such as polyamides and materials forming printed circuit boards.

In some embodiments, the substrate includes a native oxide layer on its surface. For example, if a silicon wafer is used as the substrate, the silicon wafer may include a layer of native $SiO_2$.

In some embodiments, the substrate includes a barrier coating. The barrier coating inhibits the diffusion of metal species from the deposited metal layer from reaching the substrate. Typically, between about 30 angstroms and 500 angstroms (e.g., about 50 angstroms or more, about 100 angstroms or more, about 250 angstroms or more, about 400 angstroms or more) of barrier coating material is deposited (e.g., by CVD, CFD, ALD, and PVD, such as sputtering) onto the substrate. Examples of barrier coatings include TiN, Ta, and TaN. Materials forming barrier coatings can also include surface oxides, that may affect the adhesion properties of a metal layer to the barrier coating.

In some embodiments, the substrate includes a dielectric material such as dense carbon doped oxide prepared by PECVD or porous silicate or organosilicate materials prepared by CVD, supercritical fluid deposition or spin-on (e.g., spin coating) techniques.

In general, a variety of materials can be used to form a coating on the substrate surface to enhance the adhesion of the metal layer to the surface. Typically, the adhesion-promoting materials are acidic (e.g., the materials increase the concentration of hydronium ions ($H_3O^+$) when added to a pure water), including acidic organic materials The material can be selected to decompose at the deposition conditions of the metal layer. For example, in some embodiments, an acidic organic material selected decomposes upon depositing a metal species such as copper at 225° C. In some embodiments, the material decomposes after a metal deposit catalyzes the decomposition reaction. For example, an acidic organic layer can begin to decompose upon the formation of clusters (e.g., islands) of metal deposits.

Examples of acidic organic materials include acrylic acid, myristic acid, muramic acid, polyacrylic acid, polystyrene sulfonic acid, poly(vinylphosphonic acid, dicarboxylic acid, such as maleonic acid, succinic acid, and pimelic acid, and poly(2-alkylacrylic acid), such as poly(2-methylacrylic acid), poly(2-ethylacrylic acid), and poly(2-propylacrylic acid).

In some embodiments, polymer materials (e.g., homopolymers or copolymers) can be used to form the acidic organic material. Examples of copolymer materials include poly(m-ethyl acrylate-co-acrylic acid) and poly(ethyl acrylate-co-acrylic acid).

In certain embodiments, a layer of an adhesion promoting material can be formed by reacting (e.g., polymerizing) a precursor material that is deposited onto the substrate surface. For example, acrylic acid can be polymerized (e.g., by exposure to radiation, such as ultraviolet radiation) to form a layer of polyacrylic acid on the substrate surface.

In some embodiments, the material deposited on the substrate surface (e.g., an acidic organic layer) impedes the diffusion of species into porous substrates during deposition of the metal layer. For example, a polyacrylic acid layer can impede diffusion of precursors for ruthenium (Ru) during the deposition of ruthenium on a porous substrate.

In general, a variety of different metals can be deposited onto the substrate surface coated with the adhesion-promoting material. In some embodiments, the material(s) selected to form the metal layer provide the structure with a conductive interconnect. In certain embodiments, the material selected to form the metal layer has a low electrical resistance (e.g., less than about $1 \times 10^{-6}$ $\Omega$-m). In some embodiments, the materials used to form the metal layer are selected to inhibit (e.g., provide a barrier to) copper diffusion to the substrate. In certain embodiments, the materials selected to form the metal layer are chosen based on availability and reaction characteristics of precursor materials (e.g., temperature and pressure used to react precursor materials to form the deposited metal layer). Examples of materials that can be used to form the metal layer include copper, cobalt, platinum, palladium, gold, rhodium, ruthenium, silver, and nickel, and alloys and mixed metal deposits thereof. In some embodiments, the metallic material used to form the metal layer is doped with phosphorous, tungsten or boron.

In general, the thickness of each of the substrate, acidic organic layer, and the metal layer within the structure can be varied as desired. In some embodiments, the thickness of the substrate is between about 50 microns and about 5 millimeters (e.g., about 100 microns to about 1 millimeter, and about 250 microns to about 750 microns, the thickness of the acidic organic layer is between about 0.2 nanometers (e.g. the thickness of a monolayer of material) and about 30 nanometers (e.g., about 5 nanometers, about 10 nanometers, about 15 nanometers, about 20 nanometers, or about 25 nanometers), and the thickness of the metal layer is between about 1 nanometers and about 1000 nanometers (e.g., about 15 nanometers, about 25 nanometers, about 50 nanometers, about 75 nanometers, about 100 nanometers, about 250 nanometers, about 500 nanometers, or about 750 nanometers). In some embodiments, the thickness of the acidic organic layer is about 2 nanometers or less and the thickness of the metal layer is about 50 nanometers or less.

Structure Preparation

The layers of the structure can be prepared by first coating a substrate with the acidic organic layer. The organic layer can, for example, be applied and adhered to the substrate by any of the deposition techniques described herein (e.g., spin-coating, vapor deposition including CVD, plasma-enhanced CVD and ALD, polymerization including photopolymerization, thermal polymerization and plasma polymerization, self-assembled monolayers, or surface modification chemistry).

Referring to FIG. 1, a substrate 101 having a layer 102 of an adhesion-promoting material is placed in a deposition reactor 100. Reactor 100 is a cold wall reactor that includes a reaction chamber 105 surrounded by a top flange 110 and a bottom flange 120. The top and bottom flanges are include ceramic liners 140 and an o-ring 122 creates a seal between flanges. Substrate 101 is positioned on a pedestal 130 (e.g., an aluminum pedestal) within chamber 105. A number of ports provide access to chamber 105 once the flanges are secured to each other. For example, top flange 110 includes an inlet 112, a thermocouple inlet 114, an outlet 116, and an additional access port 124 (e.g., for feeding electrical conduits for heating though bottom flange 120 into the chamber). Additionally, bottom flange 120 includes a feedthrough 118 (e.g., a Conax feedthrough).

Typically, chamber 105 is flushed with gas (e.g., argon or nitrogen) to purge the system prior to deposition. Reactor 100 heats and pressurizes the chamber atmosphere to the selected deposition conditions (e.g., temperature and pressure at which the precursor materials decompose and react to form a deposited metal layer on the substrate). In some embodiments, the temperature range for metal deposition is between about 75° C. and about 450° C. (e.g., between about 100° C. and about 300° C., between about 225° C. and about 275° C., such as about 260° C.) and the pressure within the reactor is between about 80 bar and about 400 bar (e.g., between about 100 bar and about 300 bar, between about 150 bar and about 25 bar, such as about 200 bar). The metal precursor materials and carrier solvent/gas are released into the reactor through inlet 112. The carrier solvent/gas transports the precursor materials to substrate 101 where the decomposed precursor materials react to form the deposited layer.

Adhesion Characteristics of Metal Layers on Substrates

The adhesion of a structure formed using the methods described above can be tested using the scribe tape test. The scribe tape test, as described herein, involves scoring the deposited metal film in a crosshatched pattern followed by application and removal of a piece of tape. A particular sample is deemed to pass the scribe tape test if no metal is visibly transferred to the tape after the tape is removed from the test surface. Although qualitative in nature, the scribe tape test is a demanding method that is commonly employed to access film adhesion.

In general, structures that resulted from depositing metal layers onto acidic organic coated substrates under conditions in which the acidic organic layer is substantially consumed pass the scribe tape test, while structures made with similar materials, but without the acidic organic layer have shown much weaker adhesion and can fail the scribe tape test.

In general, other methods can be used for measuring adhesion of a structure formed using the methods described above. For example, a four point bending test, which yields quantitative values of adhesion can be used to assess adhesion of the metal layer to the substrate. In embodiments in which quantitative measurements are employed, structures formed using the methods described above show at least about a 10% (e.g., about a 15% or more, about 20% or more, about 25% or more, about 30% or more, about 35% or more) improvement in adhesion properties over structures made with similar material, but without the acidic organic layer.

Metal/Substrate Interface Characteristics

The purity of the layers within a structure, as well as the purity of the interface region between the layers, can be assessed using X-ray photoelectron spectroscopy (XPS). XPS depth profiles of layered structures can be used to determine the presence or absence of chemical species throughout the thickness of the structure. For example, the presence of a significant amount of carbon atoms (e.g., about 10% or more of the atomic concentration) within the sample indicates that organic materials (e.g., acidic organic materials) are present.

In general, XPS spectra collected from structures that resulted from depositing metal layers at temperatures above about 75° C. to about 100° C. onto acidic organic coated substrates indicate that less than about 10% (e.g., about 5% or less, about 4% or less, about 3% or less, about 2% or less, or about 1% or less) of the atomic concentration forming the interface comprises carbon. These spectra also indicate that less than about 10% (e.g., about 5% or less, about 4% or less, about 3% or less, about 2% or less, or about 1% or less) of the atomic concentration forming the interface comprises oxygen.

Applications

Deposition methods disclosed herein can be used in a variety of applications. For example, these methods can be used to form one or more conductive interconnects, such as copper interconnects, on a structure. Structures including conductive interconnects can be used in integrated circuits to electrically connect circuits.

Another application of the methods described above is the deposition of a metal or doped metal copper diffusion barrier onto a dielectric material. Examples include ruthenium and cobalt film containing phosphorous, boron, and/or tungsten.

Another application involves capping a copper line in an integrated circuit with a Co or Co(P) film to improve electromigration resistance. Another application is the deposition of gold to form an electrical contact within a circuit. Still yet another application is the deposition of copper in a deep trench capacitor. Other examples include the deposition of a Co/Cu, Co/Pt binary or other metal or mixed metal film for applications in magnetic data storage.

EXAMPLES

The following examples are illustrative and not limiting.

Example 1

Preparation and Characterization of a Copper Film Adhered to a Si Wafer

A copper metal film was deposited onto a silicon wafer coated with polyacrylic acid (PAA) by reduction of Bis(2,2,7-trimethyloctane-3,5-dionato)Copper ($Cu(TMOD)_2$) with hydrogen in a supercritical $CO_2$ solution. Prior to depositing the metal layer, a 5.6 nanometer thick coating of PAA was spincoated onto a surface of the silicon wafer by applying a solution of water and PAA (25 weight percent PAA, MW ~90,000 and commercially available from Polysciences, Inc. Warrington, Pa.).

To form the metal layer of the structure, the PAA coated substrate and 0.0873 grams of $Cu(TMOD)_2$ were loaded into a cold wall deposition reactor as shown in FIG. 1. The cold wall deposition reactor used had an internal volume of approximately 65 $cm^3$ and was formed of opposing 316 stainless steel flanges. The substrate was positioned on an aluminum stage in the reactor such that the PAA coated surface was facing the inlet. The reactor was flushed with nitrogen gas and the walls of the reactor were heated to 60° C. to remove any contaminants prior to deposition. Carbon dioxide ($CO_2$) was then transferred to the reactor at 60° C. and at a pressure of 125 bar using a high-pressure pump (Model 500D, ISCO, Inc.). The reactor was maintained at 60° C. and 125 bar for approximately 30 minutes to ensure complete dissolution of the precursor. To deposit the metal layer, $H_2$ was introduced into the reactor using a high-pressure manifold and the pressure in the reactor was increased to 197 bar. The stage in the reactor was heated to 270° C. to initiate deposition. After approximately 10 minutes, flow of the $H_2$ gas was stopped and the reactor was purged thoroughly with $CO_2$ to eliminate remaining precursor and by-product materials.

The reduction of $Cu(TMOD)_2$ in $H_2$ at the processing conditions in the reactor resulted in the deposition of a 169 nanometer thick copper film. Scanning electron microscopy (SEM) analysis of the film revealed that the film consisted of 150-200 nanometer well intergrown spherical grains. The resistance of the film was measured to be 2.20 $\mu\Omega$-cm.

Figure 2:
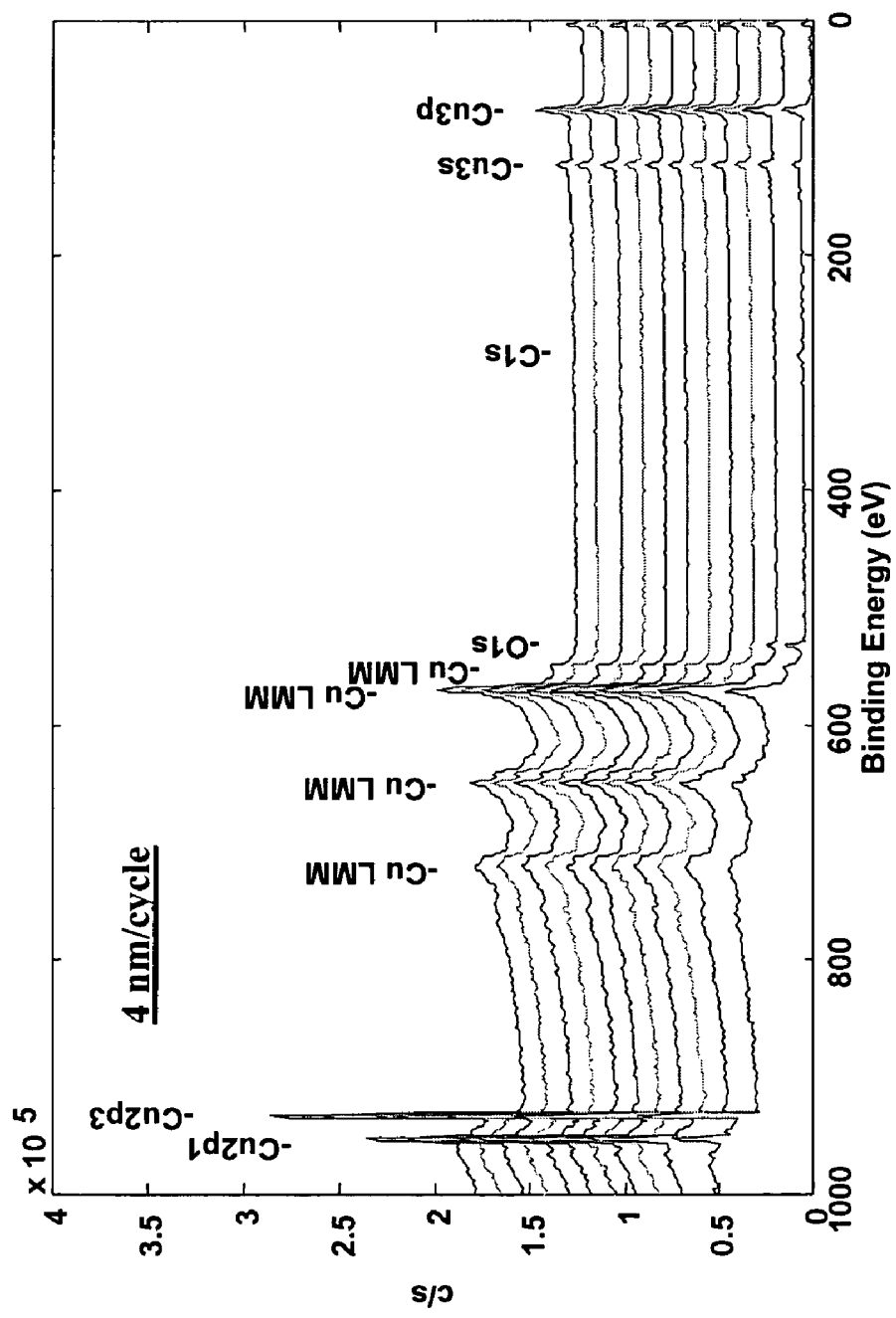
FIG. 2 is an x-ray photoelectron spectroscopy depth profile of a 169 nm thick copper film deposited on a polyacrylic acid coated silicon substrate.

XPS data indicated that carbon and oxygen contamination are present only at the surface of the structure. FIG. 2 shows an XPS depth profile of the structure through the copper film at 4 nm intervals. The spectra are stacked in the figure for comparison purposes. The spectrum at the bottom of the figure corresponds to the surface survey of the structure and the spectra above were taken at 4 nm/cycle intervals into the film (e.g., XPS spectra taken after 4 nm of material was removed from the structure by sputtering). The C 1s signal (a peak at 284.5 eV) was not detected after the first 4 nm sputtering into the copper film. The O 1s signal (a peak at 531.0 eV) was detected only within the first 8 nm of the copper film and is likely present due to ambient oxidation. The XPS data also indicates that the copper film is essentially free of impurities, which is consistent with the low resistivity of this film.

For a reference on XPS see Christmann, K., *Introduction to Surface Physical Chemistry*; Springer-Verlang: New York (1991), chapter 4.

The scribe-tape test was conducted on the copper film of this example in accordance with the procedures described above. None of the grid pieces formed in the copper film were released from the structure when the tape was removed.

Example 2

Preparation and Characterization of a Copper Film Adhered to a Si Wafer

A 140 nanometer thick copper film was deposited on a silicon wafer coated with PAA (5 nanometer thick) by reduction of 0.1450 grams of Bis(2,2,7-trimethyloctane-3,5-dionato)Copper ($Cu(TMOD)_2$) with hydrogen in a supercritical $CO_2$ solution, as generally described in Example 1. The copper film in this example was deposited at a temperature of 250° C. and a pressure of 170 bar.

Figure 3:
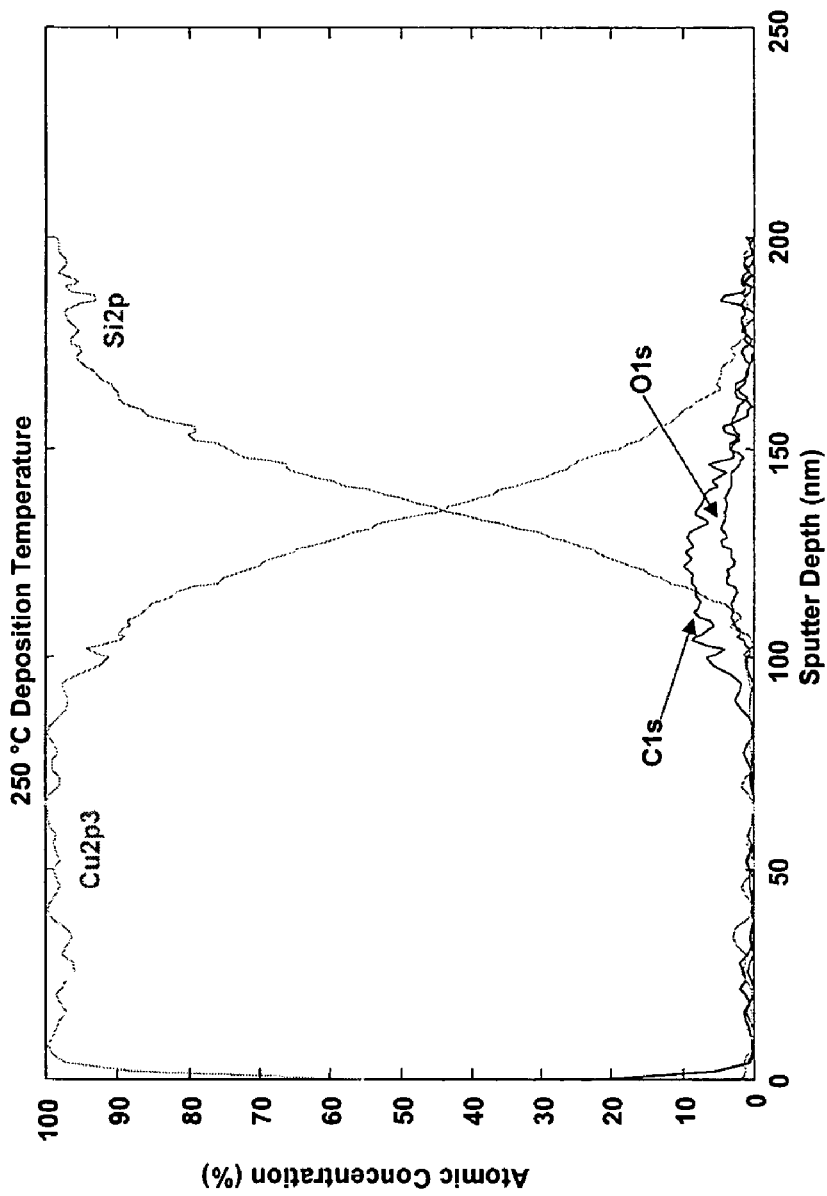
FIG. 3 is an x-ray photoelectron spectroscopy depth profile of a 140 nm thick copper film deposited on a polyacrylic acid coated silicon substrate.

Following deposition of the copper layer, the chemical purity of the interface region between the substrate and the copper film was assessed using XPS. An XPS depth profile of the 140 nanometer thick copper film, see FIG. 3, revealed a 50 nanometer wide region containing atomic concentrations of 8% of carbon and of 5% of oxygen. The quantities of carbon and oxygen present at the interface (e.g., 8% and 5%, respectively) are likely vestiges of the PAA layer. However, if the PAA layer was not affected by the deposition of the copper film, the concentrations of carbon and oxygen would be significantly higher (e.g., greater than at least 10%).

The scribe-tape test was conducted on the copper film of this example in accordance with the procedures described above. None of the grid pieces formed in the copper film were released from the structure when the tape was removed.

Example 3

Preparation and Characterization of a Copper Film Adhered to a Si Wafer Including a Two Nanometer Native $SiO_2$ Layer A 150 nanometer thick copper film was deposited on a silicon wafer including a two nanometer native $SiO_2$ layer and a 3.5 nanometer PAA layer. The copper film was deposited by reduction of 0.1497 grams of $Cu(TMOD)_2$ with hydrogen in a supercritical $CO_2$ solution, as generally described in Example 1, except the copper film was deposited at a temperature of 270° C. and a pressure of 170 bar.

Figure 4A:
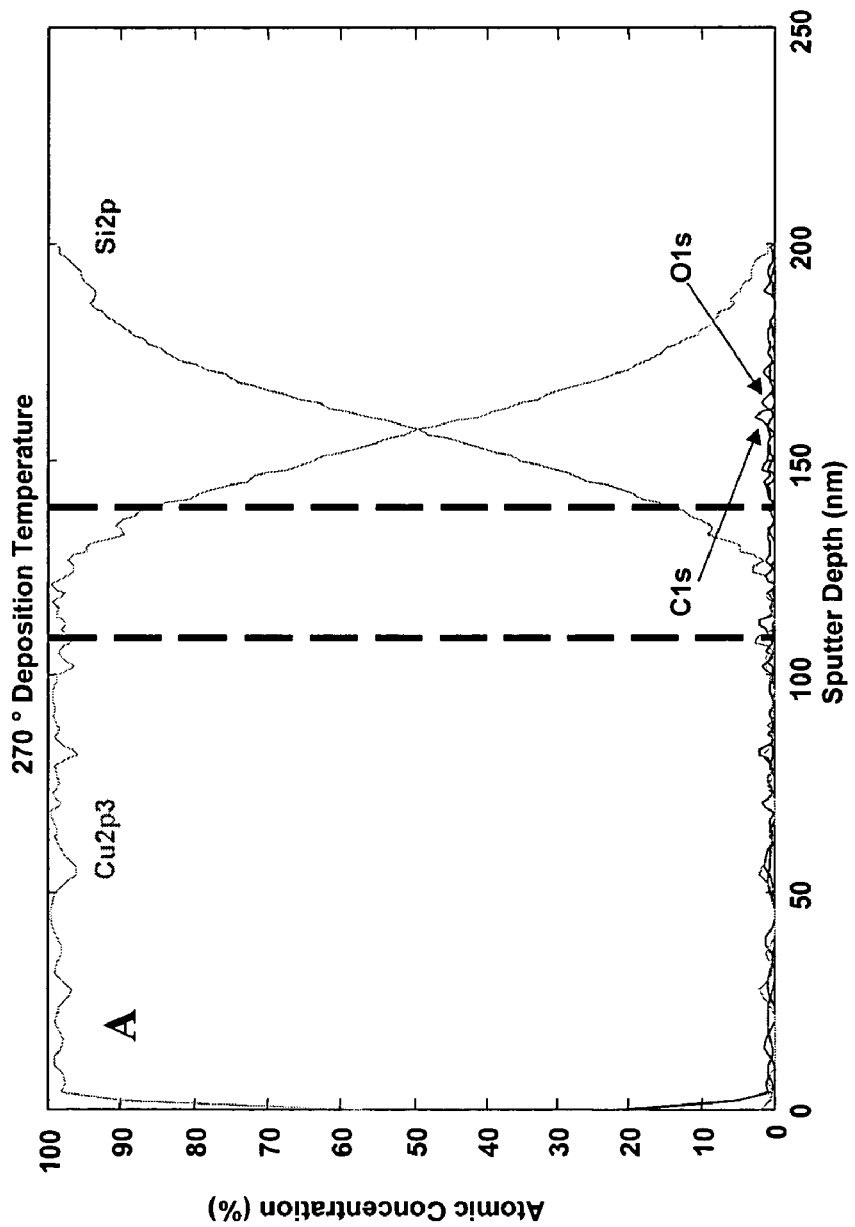
FIGS. 4A-4B are x-ray photoelectron spectroscopy spectra that show an analysis of a copper film deposited on a polyacrylic acid coated SiO$_2$/Si wafer.

XPS depth profile data from this structure (see FIG. 4A) indicate that significant quantities of carbon and oxygen were absent from the interface region. As a result, it was determined that not only had the PAA layer been consumed during deposition of the copper, but also the native $SiO_2$ layer had been reduced/etched away.

Figure 4C:
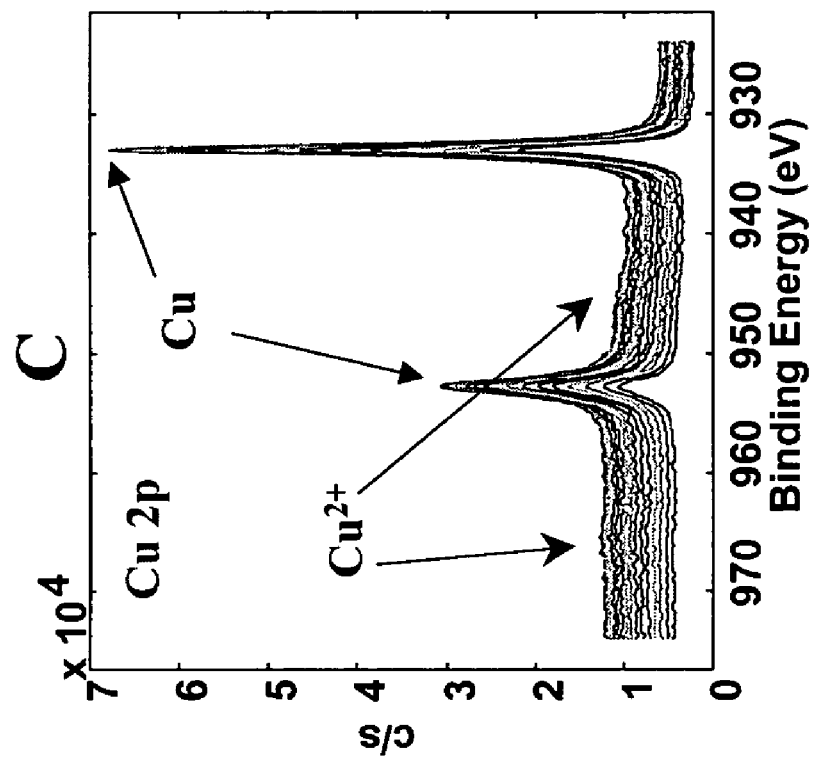
FIG. 4C is Cu 2p spectra collected within the same region of the copper film as for FIG. 4B.
Figure 4B:
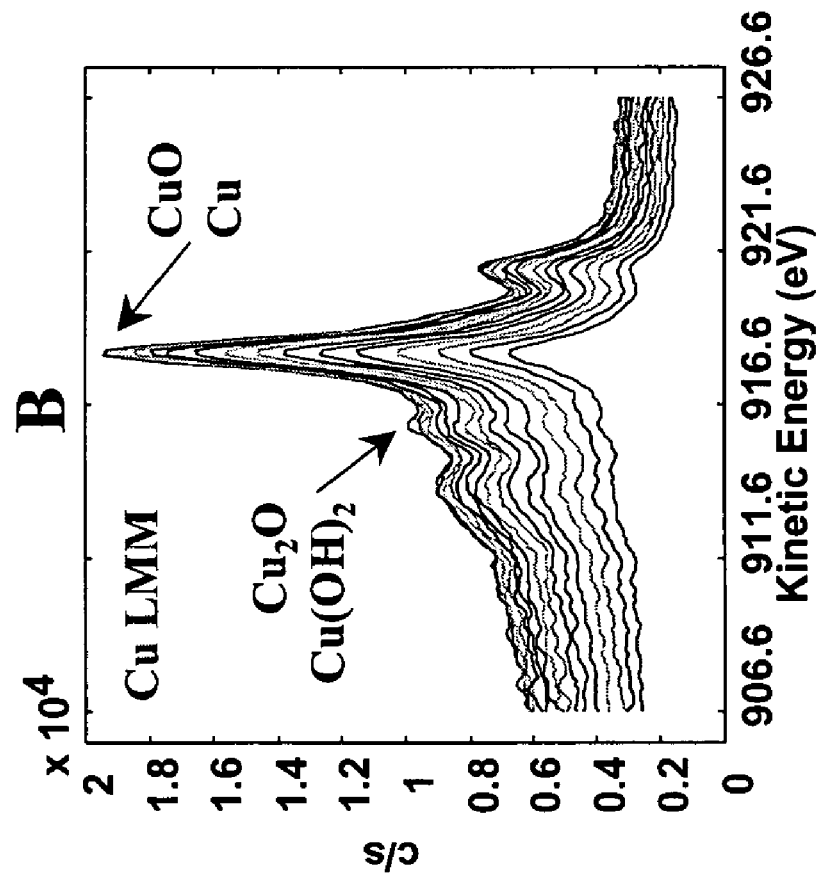

Gradual depth XPS profiling can also be used to study the chemical states of the elements at the interface. FIGS. 4B and 4C are XPS studies of the Cu Auger peak and Cu 2p regions for the structure prepared according to this example. The region of the structure studied by gradual depth profiling is marked by the dashed line in FIG. 4A. By combining Cu 2p and x-ray induced Auger peaks, it is possible to identify four chemical states of copper: $Cu^0$, $Cu_2O$, $CuO$ and $Cu(OH)_2$. The binding energy of $Cu^0$ is 932.7 eV. It is difficult to separate $Cu_2O$ from $Cu^0$ as the difference of the binding energy is only about 0.1 eV. However, there is a significant difference between $Cu^0$ and $Cu^{1+}$ in the Auger kinetic energy. For $Cu^{2+}$, two apparent satellite peaks appear at higher binding energies relative to the $2p_{1/2}$ and $2p_{3/2}$ peaks, respectively. As a result, depth profile data shown in FIGS. 4B and 4C indicate that copper at the interface was primarily present as $Cu^0$.

Figure 5:
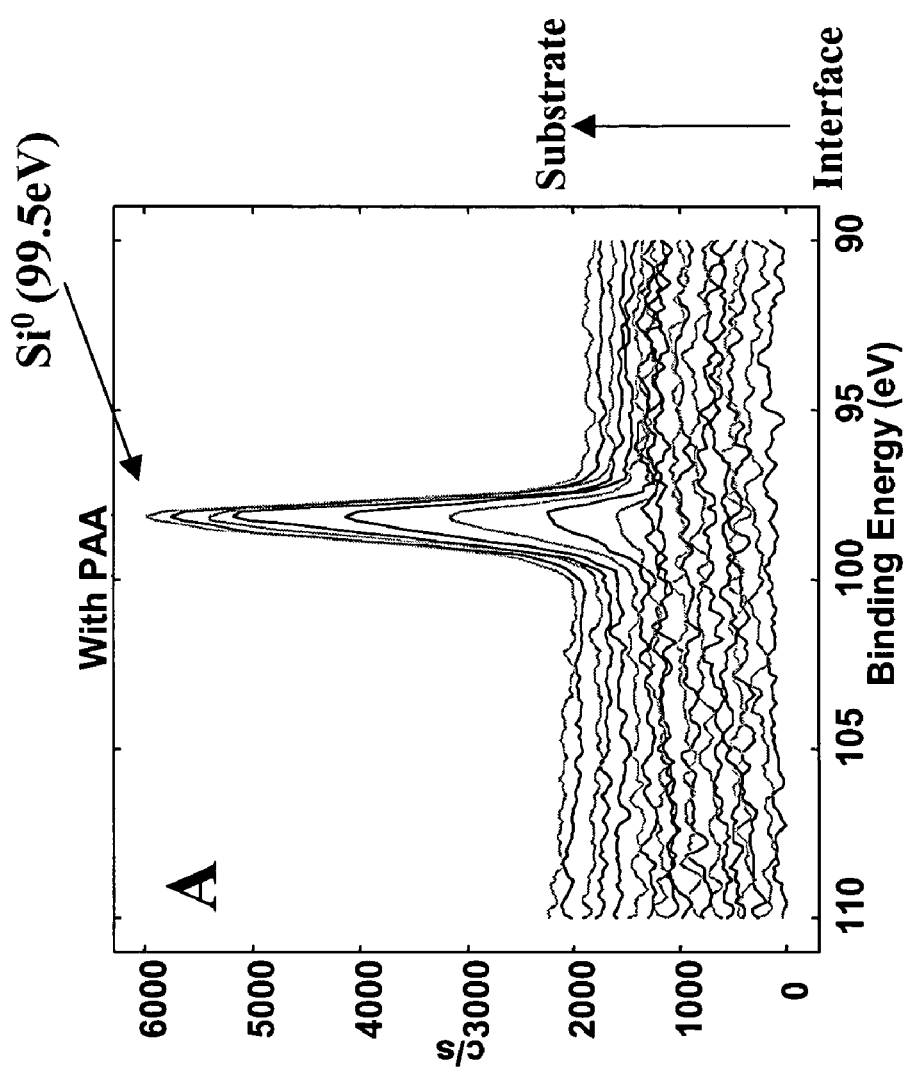
FIG. 5 are x-ray photoelectron spectroscopy spectra used to determine the chemical state of Si for a structure formed by depositing a copper film on top of a substrate including a native $SiO_2$ layer and coated with polyacrylic acid.

XPS data was also used to determine the chemical state of silicon at the interface. FIG. 5 shows depth profiling XPS data at the interface. The peak clearly identified in this scan has a binding energy of 99.5 eV, which corresponds to $Si^0$ and not to $SiO_2$, which has a binding energy of 103.3 eV. As a result, this data indicates that the native $SiO_2$ layer that was initially present (e.g., present before deposition of the metal layer) has been eliminated from the structure.

The scribe-tape test was conducted on the copper film of this example in accordance with the procedures described above. None of the grid pieces formed in the copper film were released from the structure when the tape was removed.

Example 4

Figure 6A:
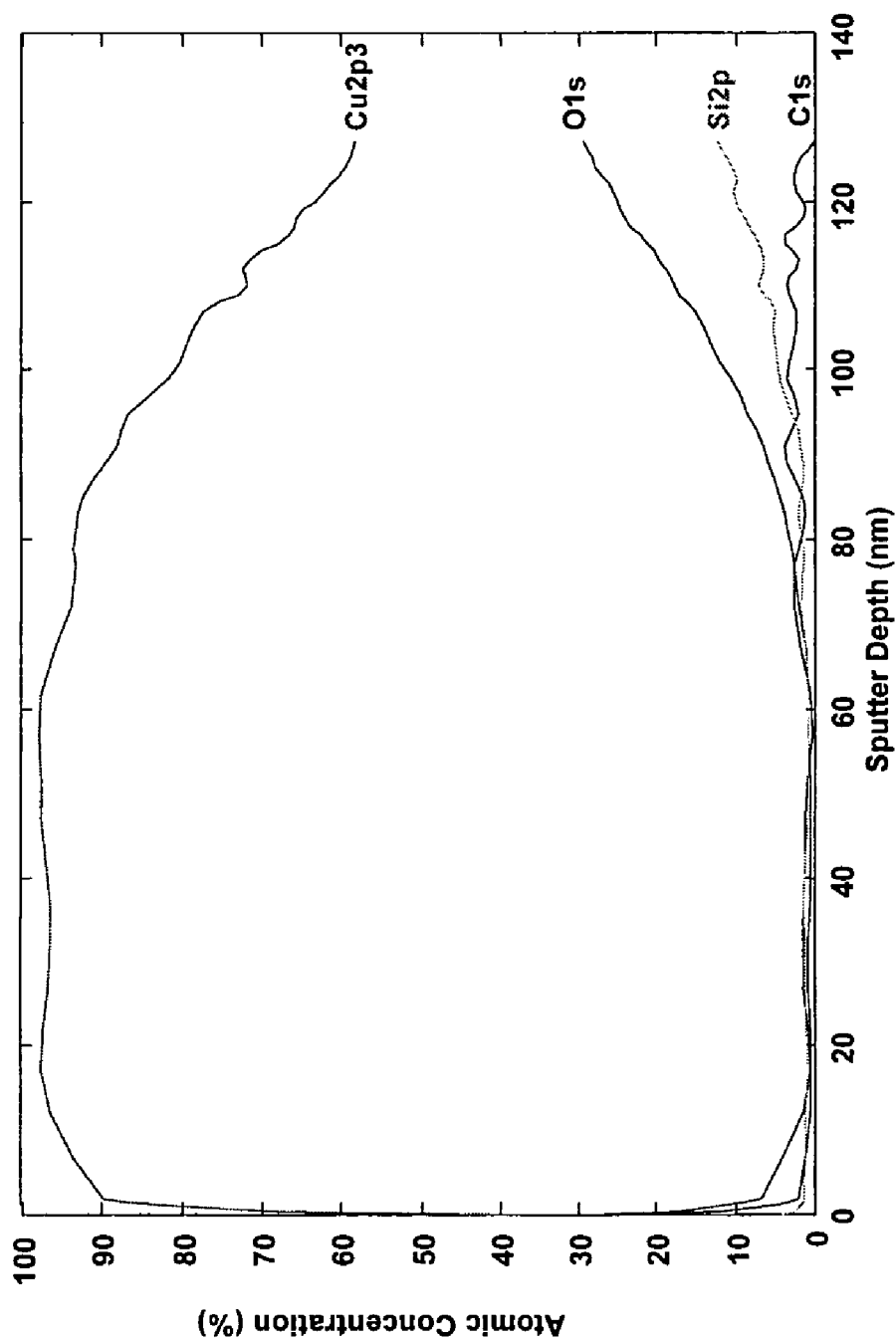
FIG. 6A is an x-ray photoelectron spectroscopy depth profile of a copper film deposited directly on a substrate including a native $SiO_2$ layer.
Figure 6B:
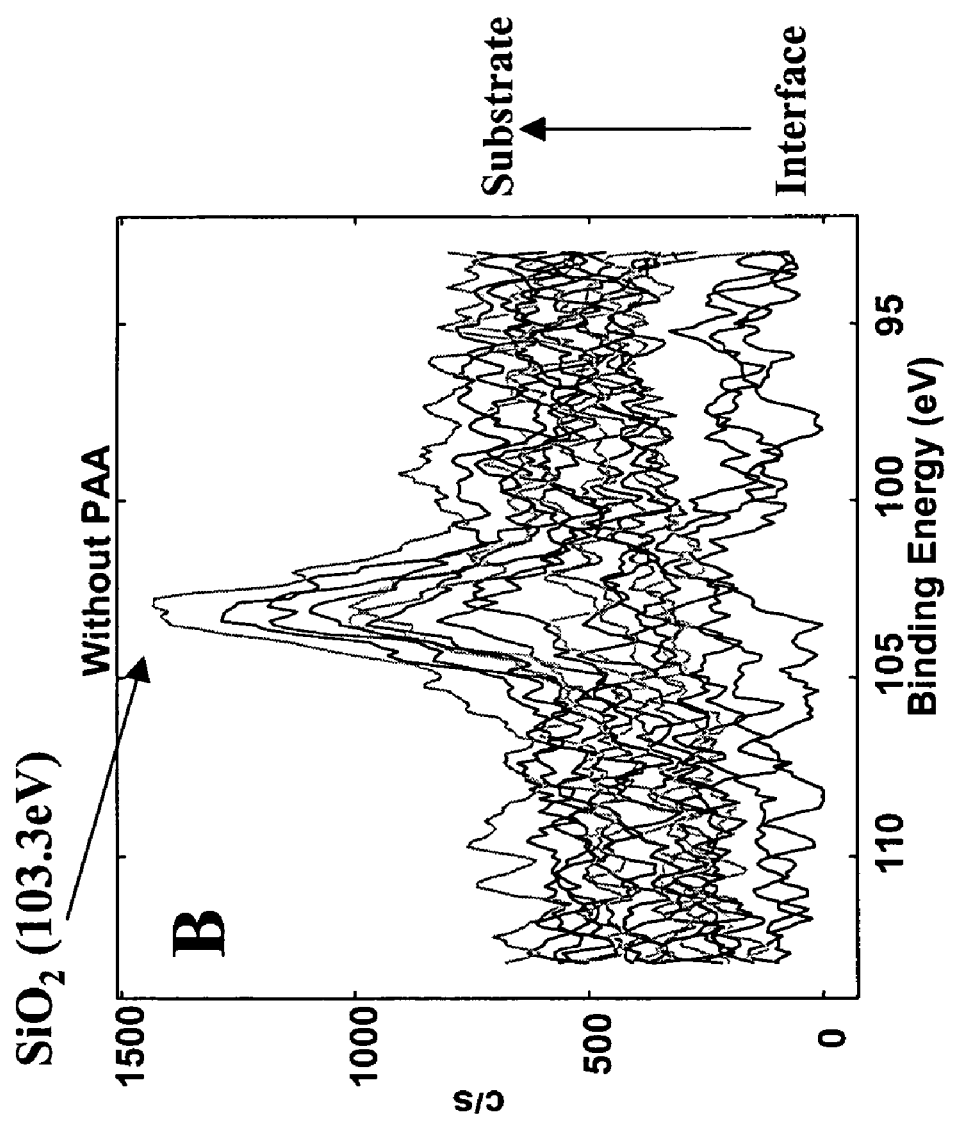
FIG. 6B is a graph showing x-ray photoelectron spectroscopy spectra used to determine the chemical state of Si for a structure formed by depositing a copper film on top of a substrate including a native $SiO_2$ layer.

Preparation and Characterization of a Copier Film Adhered to a Si Wafer Including a Two Nanometer Native Oxide The structure in this example was prepared as described in Example 4, except no PAA layer was included. XPS data taken from this structure (FIG. 6A) indicated the presence of both oxygen and carbon at the interface (e.g., at a profile depth of 120 nanometers). Referring to FIG. 6B, the XPS data from this structure further indicated that the chemical state of silicon at the interface corresponded to $SiO_2$ (binding energy of 103.3 eV) rather than $Si^0$ (binding energy of 99.5 eV).

The scribe-tape test was conducted on the copper film of this example in accordance with the procedures described above. Several of the grid pieces were removed from the structure when the tape was removed.

Example 5

Preparation and Characterization of a Copper Film Adhered to a Si Wafer Including a 300 Angstrom Layer of Ta A 143 nanometer thick copper film was deposited onto a silicon substrate including a 300 angstrom layer of Ta on the substrate's surface. The Ta layer was deposited onto the surface of the substrate using a PVD technique (i.e., sputtering). Prior to the deposition of the 143 nanometer thick copper film, the substrate (Si wafer with Ta layer ("Ta/Si wafer")) was spincoated with 5 nanometers of PAA. The copper layer was then deposited on the PAA coated substrate when 0.0653 grams of $Cu(TMOD)_2$ was reduced with hydrogen in a supercritical $CO_2$ solution, as described in Example 1. The copper film was deposited at a temperature of 270° C. and a pressure of 200 bar.

Figure 7A:
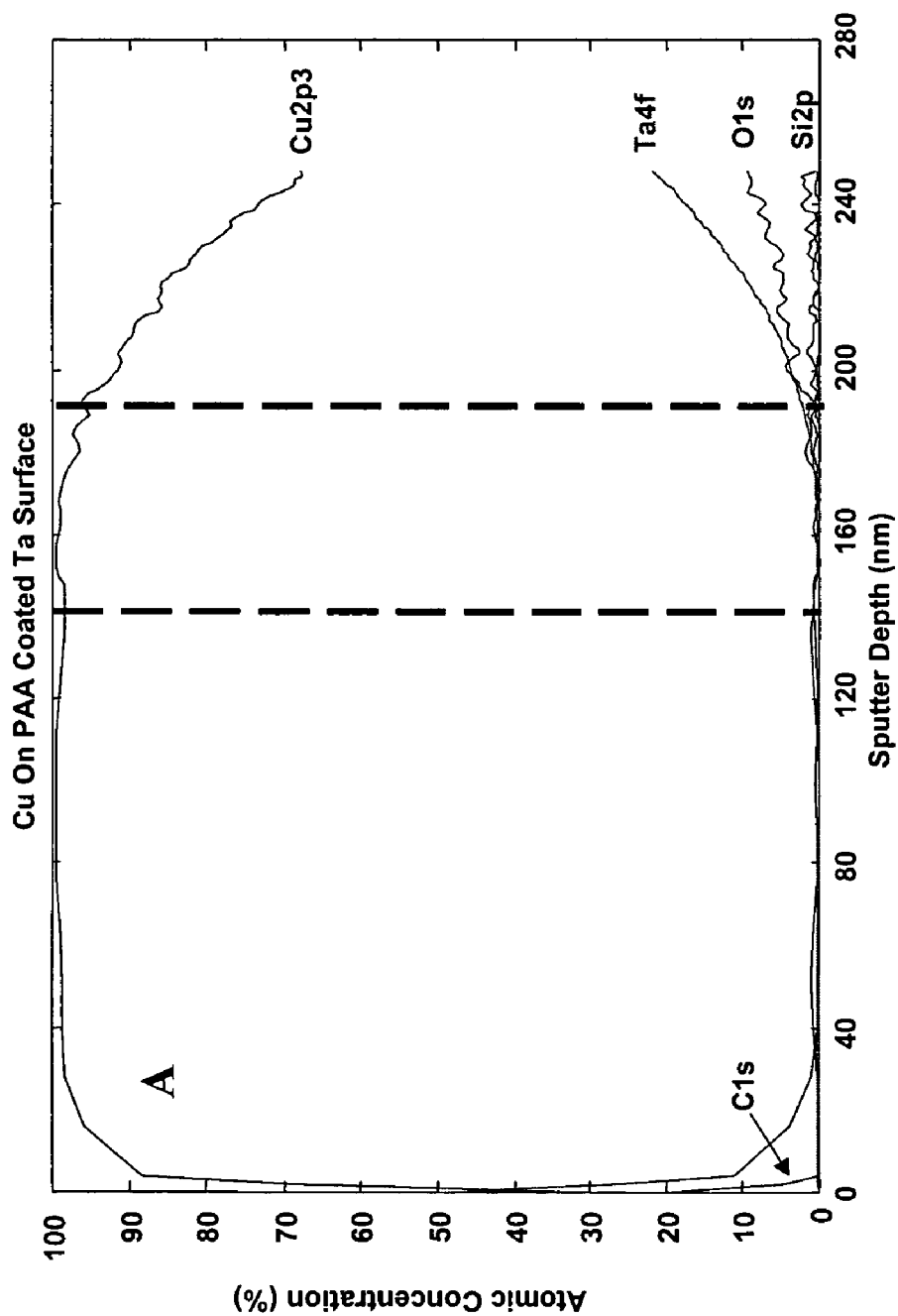
FIGS. 7A-7B are x-ray photoelectron spectroscopy spectra that show analysis of a copper film deposited on a polyacrylic acid coated Ta/Si wafer.

FIG. 7A shows depth XPS profiling data collected through the copper film of the structure of this example. A sputtering rate equal to 4 nm/cycle was used for a region of the copper film closest to the surface, and then the sputtering cycles were reduced to 1 nm/cycle at a distance of 20 nanometers above the substrate to capture the interface in detail. Again, there was no evidence of PAA at the interface (e.g., a C1s peak was not detected). Carbon and oxygen attributed to ambient exposure were detected only at the top surface of the copper film and were thus attributed to handling of the structure and not to material located at the interface.

Figures 7B, 7C:
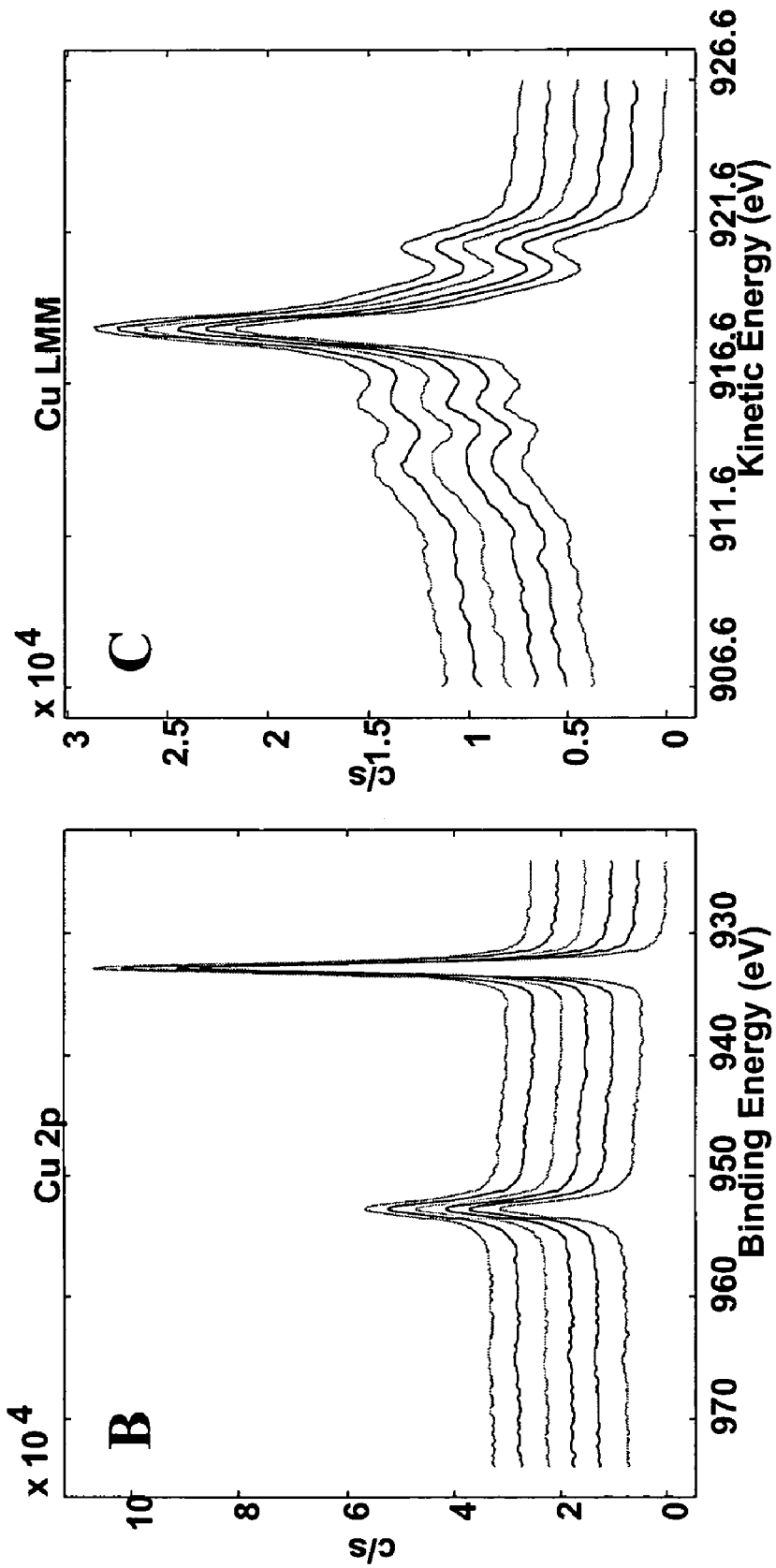
FIG. 7C is Cu LMM Auger spectra collected within the same region of the copper film as for FIG. 7B.

XPS spectra were also used to study the chemical state of copper at the interface. FIGS. 7B and 7C are XPS spectra that show an analysis of the 143 nanometer thick copper film deposited on the PAA coated Ta/Si wafer. The XPS spectra shown in FIGS. 7B and 7C indicate that the copper located at the interface is $Cu^0$, rather than CuO.

Figure 8B:
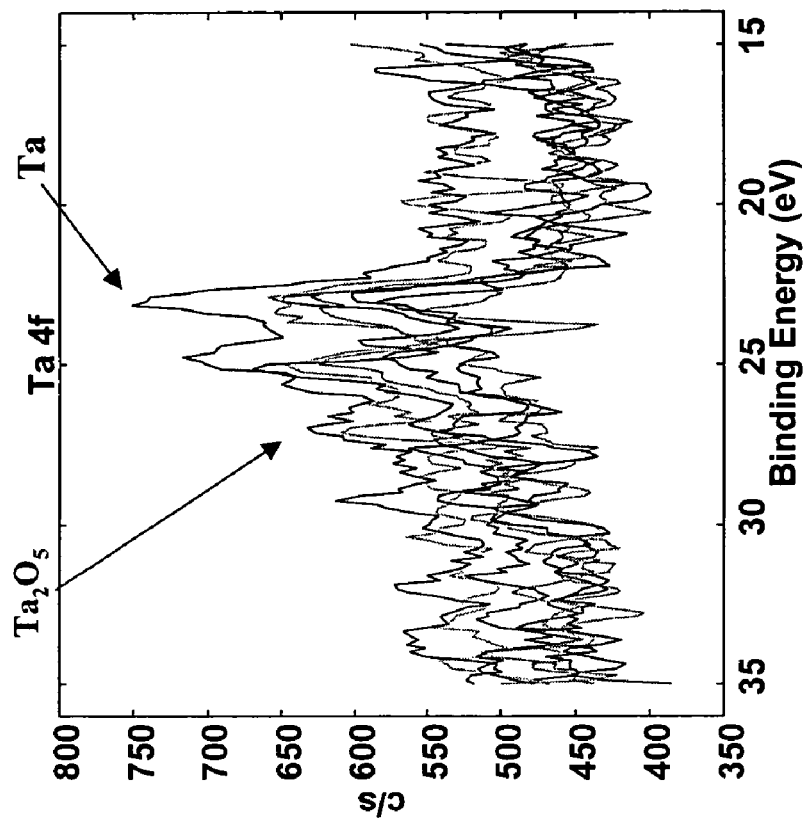
FIGS. 8A-8B are x-ray photoelectron spectroscopy spectra used to determine the chemical state of Ta within two different structures.
Figure 8A:
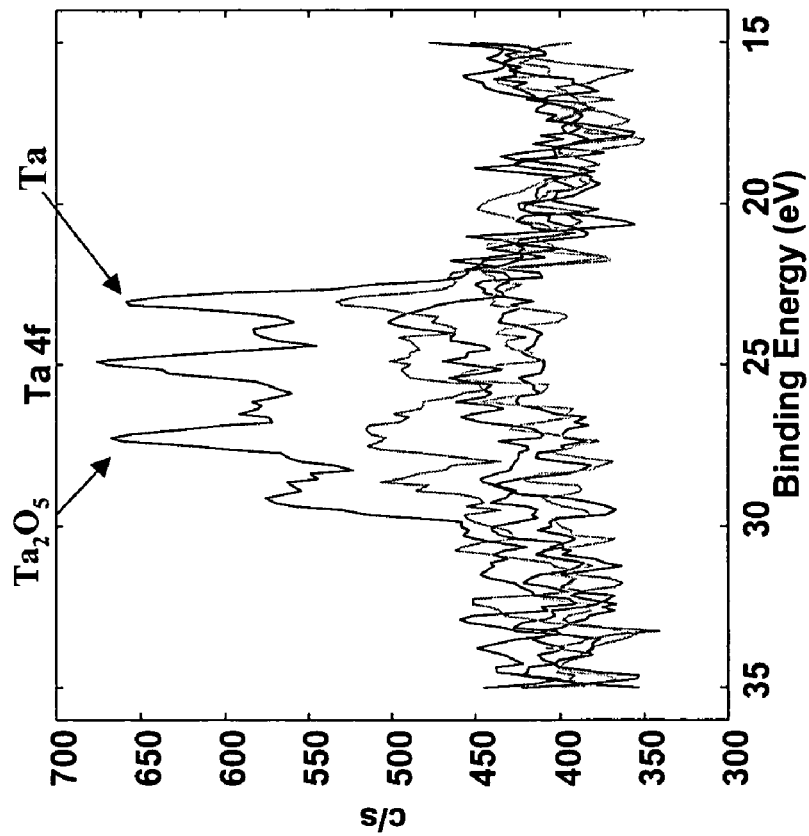

The chemical states of Ta at the interface were compared for films deposited with and without the PAA layer using the XPS signal for Ta 4f. The results are shown in FIGS. 8A and 8B. FIG. 8A, which shows the results for films deposited directly on the Ta/Si substrate, clearly shows peaks attributable to $Ta^0$ ($4f_{5/2}=21.9$ eV) and to $Ta_2O_5$ ($4f_{5/2}=26.7$ eV). FIG. 8B, which shows the results for films deposited onto the PAA layer, peaks attributable to both $Ta^0$ and $Ta_2O_5$, however the $Ta_2O_5$ peak is significantly reduced as compared to the $Ta_2O_5$ peak generated in FIG. 8A. As a result, it is clear that the oxidation of Ta at the interface is significantly reduced for films deposited on substrates treated with PAA.

The scribe-tape test was conducted on the copper film of this example in accordance with the procedures described above. None of the grid pieces formed in the copper film were released from the structure when the tape was removed.

Example 6

Preparation and Characterization of a Copper Film Adhered to a Si Wafer Including 300 Angstroms of TiN A 118 nanometer thick copper film was deposited on to a silicon substrate including a 300 angstrom layer of TiN on the substrate's surface. The TiN layer was deposited onto the substrate using CVD. Prior to the deposition of the 118 nanometer thick copper film, the substrate (Si wafer with TiN layer) was spincoated with 5 nanometers of PAA. The copper layer was then deposited on the PAA coated substrate when 0.0803 grams of $Cu(TMOD)_2$ was reduced with hydrogen in a supercritical $CO_2$ solution, as described in Example 1. The copper film was deposited at a temperature of 270° C. and a pressure of 221 bar.

The scribe-tape test was conducted on the copper film of this example in accordance with the procedures described above. None of the grid pieces formed in the copper film were released from the structure when the tape was removed.

Example 7

Preparation and Characterization of a Copper Film Adhered to a Si Wafer Including 300 Angstroms of TaN A 226 nanometer thick copper film was deposited on to a silicon substrate including a 300 angstrom layer of TaN on the substrate's surface. The TaN layer was deposited onto the substrate using CVD. Prior to the deposition of the 226 nanometer thick copper film, the substrate (Si wafer with TaN layer) was spincoated with 5 nanometers of PAA. The copper layer was then deposited on the PAA coated substrate when 0.0653 grams of $Cu(TMOD)_2$ was reduced with hydrogen in a supercritical $CO_2$ solution, as described in Example 1. The copper film was deposited at a temperature of 270° C. and a pressure of 200 bar.

The scribe-tape test was conducted on the copper film of this example in accordance with the procedures described above. None of the grid pieces formed in the copper film were released from the structure when the tape was removed.

Example 8

Preparation and Characterization of a Copper Film Adhered to a Si Wafer Including a Two Nanometer Native Oxide A silicon wafer including a two nanometer native $SiO_2$ layer was exposed to acrylic acid vapor for 5 minutes at room temperature. A 200 nm thick copper film was deposited by reduction of 0.1 grams of $Cu(TMOD)_2$ with hydrogen in a supercritical $CO_2$ solution, as generally described in Example 1, except the copper film was deposited at a temperature of 270° C. and a pressure of 205 bar.

The scribe-tape test was conducted on the copper film of this example in accordance with the procedures described above. None of the grid pieces formed in the copper film were released from the structure when the tape was removed.

Example 9

Preparation and Characterization of a Copper Film Adhered to a Patterned Si Wafer Including a Layer of TaN A patterned silicon wafer including a layer of TaN is heated above room temperature in the presence of acrylic acid vapor. A thin conformal layer of polyacrylic acid forms on a surface of the wafer by thermal polymerization. A 30 nm film is then deposited onto the surface of the wafer including the polyacrylic acid by the reduction of $Cu(TMOD)_2$ with hydrogen in a supercritical $CO_2$ solution, as generally described in Example 1, except the copper film is deposited at a temperature of 270° C. and a pressure of 200 bar.

The scribe-tape test is conducted on the copper film of this example in accordance with the procedures described above. None of the grid pieces formed in the copper film release from the structure when the tape is removed.

Example 10

Preparation and Characterization of a Copper Film Adhered to a Patterned Si Wafer Including a Layer of Ta A patterned silicon wafer including a Ta layer is exposed to acrylic acid vapor and illuminated by ultraviolet irradiation to form a thin film of polyacrylic acid on the Ta/Si wafer by photopolymerization. Copper is deposited into vias and trenches patterned on the Ta/Si wafer by the reduction of $Cu(TMOD)_2$ with hydrogen in a supercritical $CO_2$ solution, as generally described in Example 1, except that the copper film is deposited at a temperature of 270° C. and a pressure of 200 bar.

The scribe-tape test is conducted on the copper film of this example in accordance with the procedures described above.

None of the grid pieces formed in the copper film release from the structure when the tape is removed.

Example 11

Preparation and Characterization of a Copper Film Adhered to a Patterned Si Wafer Including a Layer of TiN A patterned silicon wafer including a layer of TiN is placed in a PECVD reactor to form a thin conformal layer of an acidic organic material on the TiN layer by reaction of acrylic acid. Copper is deposited into vias and trenches are patterned on the TiN/Si wafer by the reduction of $Cu(TMOD)_2$ with hydrogen in a supercritical $CO_2$ solution, as generally described in Example 1, except that the copper film is deposited at a temperature of 270° C. and a pressure of 200 bar.

The scribe-tape test is conducted on the copper film of this example in accordance with the procedures described above. None of the grid pieces formed in the copper film release from the structure when the tape is removed.

Example 12

Preparation and Characterization of a Ruthenium Film Adhered to a Patterned Si Wafer Including a Native $SiO_2$ Layer A patterned silicon wafer including a native layer of $SiO_2$ is exposed to acrylic acid vapor at an elevated temperature (e.g., above 25° C.) to form a thin conformal layer of polyacrylic acid on the native oxide layer by thermal polymerization. A 5 nanometer thick film of ruthenium is deposited onto the patterned wafer by thermal reduction of $RuCp_2$ in a supercritical $CO_2$ solution in a reactor and under conditions as generally described in Example 1.

The scribe-tape test is conducted on the copper film of this example in accordance with the procedures described above. None of the grid pieces formed in the copper film should release from the structure when the tape is removed.

Example 13

Preparation and Characterization of a Copper Film Adhered to a Si Wafer Including a Ta Layer A 3 nanometer thick polyacrylic acid layer is spin coated on to a silicon wafer including a Ta film. Copper clusters, approximately 1 to 100 microns in diameter are deposited onto the polyacrylic acid layer by chemical vapor deposition. The wafer including the copper clusters is heated to 270° C. in the presence of hydrogen to decompose the polyacrylic acid.

A tape test, as described herein, which includes applying a piece of Scotch® ¾ inch Magic™ tape available from 3M Corporation, Maplewood, Minn. (catalog number 205) to the sample and then removing the piece of tape, reveals that none of the copper clusters deposited onto the substrate are released when the tape is removed.

A copper film is then deposited onto the substrate including the clusters by chemical vapor deposition.

The scribe-tape test is conducted on the copper film of this example in accordance with the procedures described above. None of the grid pieces formed in the copper film release from the structure when the tape is removed.

OTHER EMBODIMENTS

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A method, comprising:
   providing an organic acid material on a surface of a substrate; and
   after providing the organic acid material on the surface, depositing a metal or alloy on the substrate, wherein depositing the metal or alloy comprises:
      providing a mixture that includes a metal precursor material and a reducing agent in a supercritical or near supercritical solution, and
      exposing the organic acid material provided on the substrate surface to the mixture under conditions in which the precursor undergoes a reaction which forms a layer of the deposited metal or alloy on the substrate surface and removes organic material from the substrate surface during the exposure,
   wherein there is substantially no organic material at an interface between the substrate surface and the layer of the deposited material when the reaction is complete.

2. The method of claim 1, wherein providing the organic acid material on the surface comprises forming a layer comprising the organic acid material on the surface.

3. The method of claim 2, wherein the layer comprising the organic acid material is formed by polymerizing a precursor of the organic acid material.

4. The method of claim 3, wherein the precursor of the organic acid material is polymerized by thermal polymerization or photopolymerization.

5. The method of claim 3, wherein the precursor of the organic acid material is acrylic acid and the organic acid material is polyacrylic acid.

6. The method of claim 1, wherein the organic acid material is provided by adsorption of the organic acid material onto the substrate surface.

7. The method of claim 1, wherein the organic acid material is provided by the reaction or decomposition of an organic material on the substrate surface.

8. The method of claim 1, wherein the organic acid material is a polymer.

9. The method of claim 1, wherein the layer of the deposited material is formed using chemical fluid deposition, chemical vapor deposition, or atomic layer deposition.

10. The method of claim 1, wherein the organic acid material binds, chelates, or undergoes ligand exchange with the precursor material or a derivative of the precursor material.

11. The method of claim 1, wherein the metal is copper.

12. The method of claim 1, wherein the metal is ruthenium.

13. The method of claim 1, wherein the metal is selected from the group consisting of cobalt, platinum, palladium, gold, rhodium, silver, and nickel, and alloys and mixed metal deposits thereof.

14. The method of claim 1, wherein the organic acid material on the substrate surface is exposed to the precursor material at a temperature of about 75° C. or more.

15. The method of claim 1, wherein the substrate comprises a silicon wafer.

16. The method of claim 1, wherein the substrate comprises a silicon wafer including a native oxide layer.

17. The method of claim 1, wherein the substrate comprises a silicon wafer including a barrier layer.

18. The method of claim 17, wherein the barrier layer is formed of a material selected from the group consisting of TiN, Ta, TaN, Ru, and Co.

19. The method of claim 1, wherein the substrate comprises a polymer.

20. The method of claim 1, wherein the substrate surface comprises at least one trench or at least one via.

21. The method of claim 1, wherein the reducing agent is hydrogen.

22. The method of claim 1, wherein the supercritical solution is a solution in which the temperature and pressure of the solution are greater than the respective critical temperature and pressure of the solution.

23. The method of claim 1, wherein the supercritical solution is a solution of the metal precursor in supercritical carbon dioxide.

24. The method of claim 1, wherein the near supercritical solution is a solution in which a reduced temperature factor, which is defined by the ratio of an actual temperature measured in Kelvin and the critical temperature of the solution measured in Kelvin, is greater than 0.8 and a reduced pressure parameter, which is defined by the ration of an actual pressure and a critical pressure of the solution, is greater than 0.5 and the solution is not a supercritical solution.

25. The method of claim 1, wherein the near supercritical solution is a solution of the metal precursor in near supercritical carbon dioxide.

26. A method, comprising:
providing an organic acid material on a surface of a substrate; and
after providing the organic acid material on the surface, depositing a metal or alloy on the substrate, wherein depositing the metal or alloy comprises:
dissolving a metal precursor in a supercritical or near supercritical solution; and
exposing the organic acid material on the substrate surface to the metal precursor in the supercritical or near supercritical solution under conditions which form a layer of the metal on the substrate surface from the metal precursor.

27. A method, comprising:
coating a surface of a substrate with polyacrylic acid coating;
loading the substrate with the polyacrylic acid coating into a deposition reactor;
providing a mixture of a metal precursor and carbon dioxide in the deposition reactor as a supercritical or near supercritical carbon dioxide solution; and
by a reaction of the metal precursor and the polyacrylic acid coating, forming a layer of a deposited metal on the substrate surface.

28. The method of claim 27, further comprising:
adjusting the temperature and the pressure of the supercritical or near supercritical carbon dioxide solution within the deposition reactor; and
before adjusting the temperature and the pressure within the deposition reactor, adding hydrogen to the mixture in the deposition reactor.

29. The method of claim 27, further comprising:
increasing the pressure of the supercritical or near supercritical carbon dioxide solution to at least 170 bar and increasing the temperature of the supercritical or near supercritical carbon dioxide solution to at least 250 Celsius.

30. A method, comprising:
providing an organic acid material on a surface of a substrate; and
after providing the organic acid material on the surface, depositing a metal or alloy on the substrate, wherein depositing the metal or alloy comprises:
providing a mixture that includes a metal precursor material and a reducing agent in a supercritical or near supercritical solution, and
exposing the organic acid material provided on the substrate surface to the mixture under conditions in which the precursor undergoes a reaction which forms a layer of the deposited metal or alloy on the substrate surface and removes organic material from the substrate surface during the exposure,
wherein there is substantially no organic material at an interface between the substrate surface and the layer of the deposited metal or alloy when the reaction is complete,
wherein providing the organic acid material on the surface comprises forming a layer comprising the organic acid material on the surface, and
wherein the layer comprising the organic acid material is a self-assembled monolayer.

* * * * *